(12) United States Patent
Gonzalez

(10) Patent No.: US 6,964,896 B2
(45) Date of Patent: Nov. 15, 2005

(54) METHODS OF FORMING SEMICONDUCTOR LOGIC CIRCUITRY, AND SEMICONDUCTOR LOGIC CIRCUIT CONSTRUCTIONS

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,579

(22) Filed: Aug. 31, 2004

(65) Prior Publication Data

US 2005/0026347 A1 Feb. 3, 2005

Related U.S. Application Data

(62) Division of application No. 09/797,098, filed on Feb. 28, 2001, now Pat. No. 6,887,753.

(51) Int. Cl.$^7$ .................. H01L 21/8222; H01L 29/788
(52) U.S. Cl. ............... 438/241; 257/316; 257/369; 257/330
(58) Field of Search ................... 438/135, 253, 438/241, 302, 301, 303; 257/296, 330, 316, 257/369, 350, 353, 343, 363

(56) References Cited

U.S. PATENT DOCUMENTS

| | | | |
|---|---|---|---|
| 5,374,581 A | 12/1994 | Ichikawa et al. | |
| 5,953,622 A | 9/1999 | Lee et al. | |
| 6,034,894 A * | 3/2000 | Maruyama et al. | 365/185.17 |
| 6,187,624 B1 | 2/2001 | Huang | |
| 6,245,661 B1 | 6/2001 | Matsumoto et al. | |
| 6,251,754 B1 | 6/2001 | Ohshima et al. | |
| 6,255,160 B1 | 7/2001 | Huang | |
| 6,259,118 B1 * | 7/2001 | Kadosh et al. | 257/67 |
| 6,423,992 B2 | 7/2002 | Fukuda et al. | |
| 6,429,070 B1 | 8/2002 | Gonzalez et al. | |
| 6,437,369 B1 | 8/2002 | Tang | |
| 6,462,817 B1 | 10/2002 | Strocchia-Rivera | |
| 6,617,632 B2 * | 9/2003 | Taniguchi et al. | 257/296 |
| 6,635,552 B1 | 10/2003 | Gonzalez | |
| 6,638,834 B2 | 10/2003 | Gonzalez | |
| 6,645,846 B2 | 11/2003 | Drynan et al. | |
| 6,734,062 B2 | 5/2004 | Gonzalez et al. | |
| 6,740,583 B2 | 5/2004 | Juengling | |
| 6,882,010 B2 * | 4/2005 | Bhattacharyya | 257/350 |

FOREIGN PATENT DOCUMENTS

EP 0056186 A2 * 7/1982 .......... H01L 21/70

* cited by examiner

Primary Examiner—Howard Weiss
Assistant Examiner—(Vikki) Hoa B. Trinh
(74) Attorney, Agent, or Firm—Wells St. John P.S.

(57) ABSTRACT

The invention includes a method of forming semiconductor circuitry wherein a first semiconductor structure comprising a first monocrystalline semiconductor substrate is bonded to a second semiconductor structure comprising a second monocrystalline semiconductor substrate. The first semiconductor substrate has a semiconductive material projection extending therefrom, and the second semiconductor substrate has an electrically conductive interconnect extending therethrough. The interconnect electrically connects with the semiconductive material projection, and comprises a different dopant type than the semiconductor material projection. The invention also includes a method of bonding a first monocrystalline semiconductor substrate construction to a second monocrystalline semiconductor substrate construction, wherein the first construction is doped to a first dopant type, and the second construction is doped to a second dopant type different from the first dopant type. The invention further includes methods of forming semiconductor logic circuitry, and includes semiconductor constructions, such as, for example, semiconductor logic circuitry constructions.

22 Claims, 6 Drawing Sheets

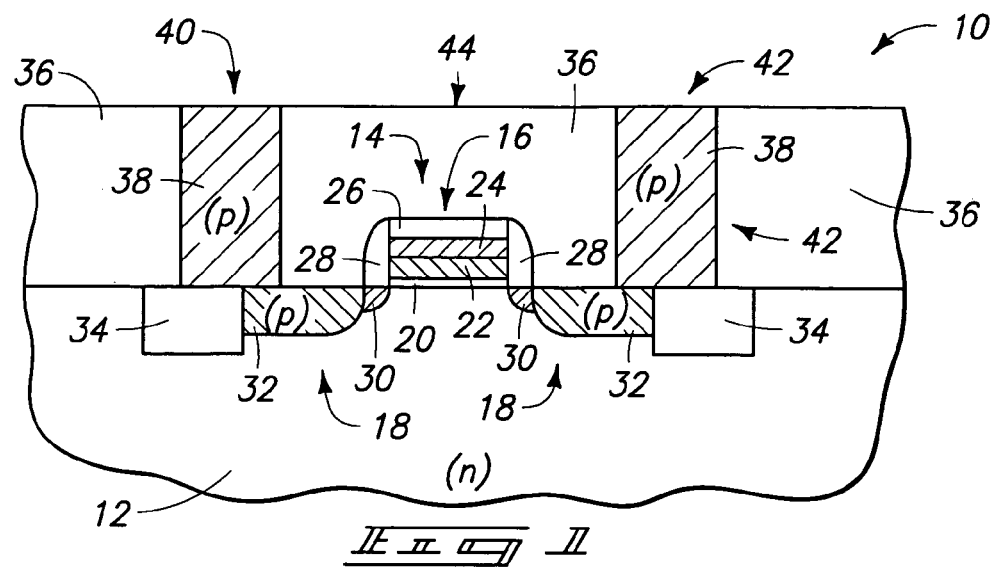
_FIG. 1_
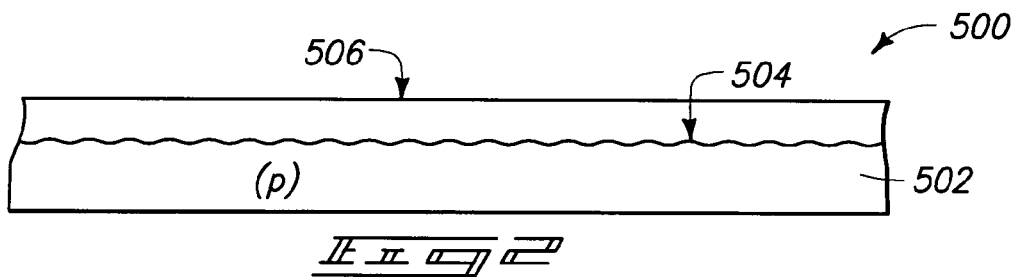
_FIG. 2_
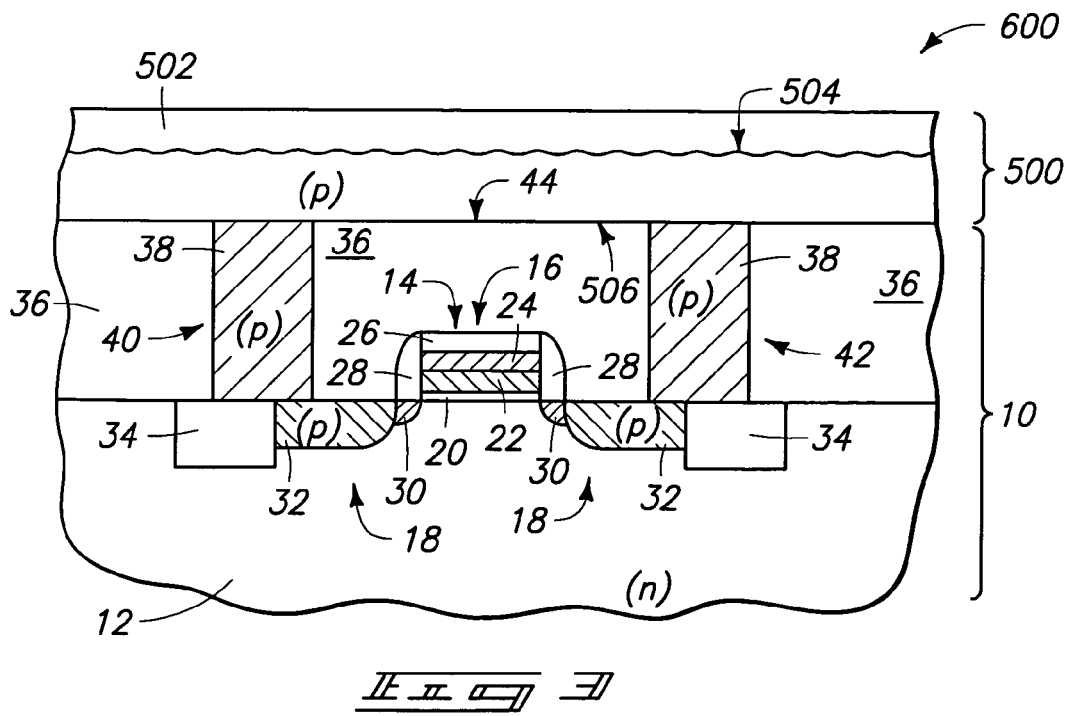
_FIG. 3_

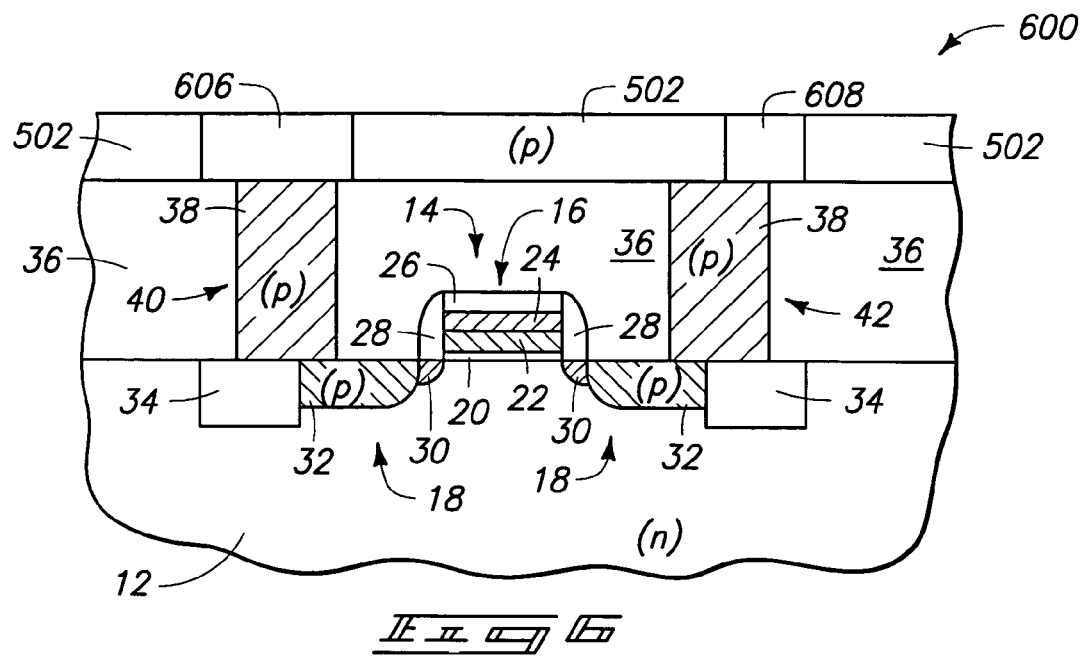
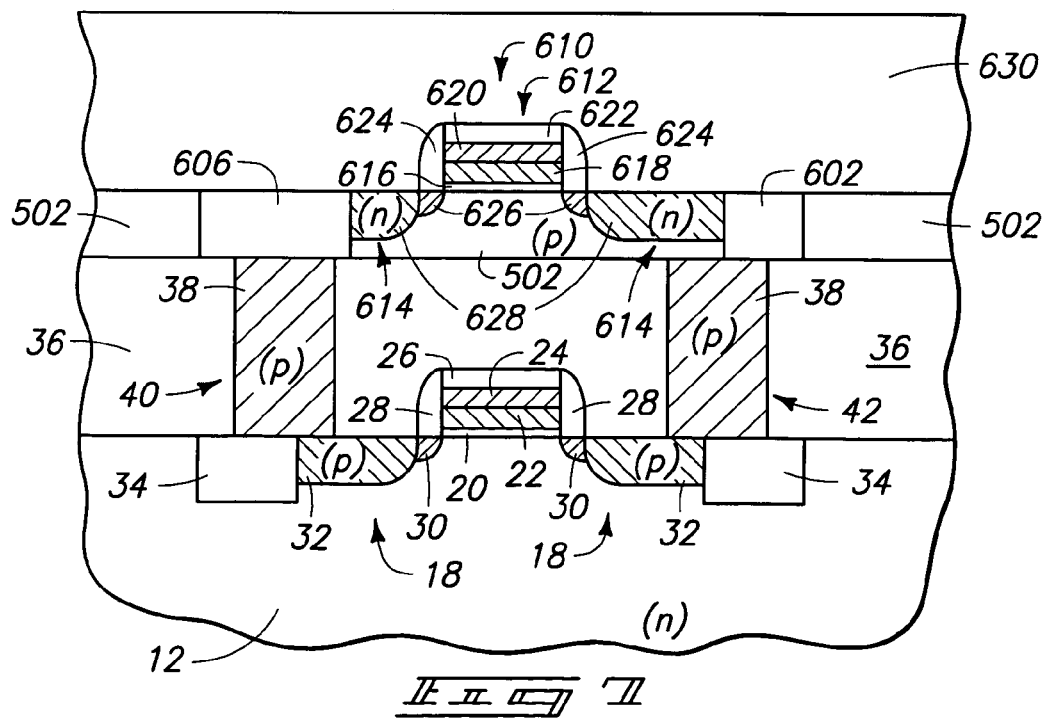

METHODS OF FORMING SEMICONDUCTOR LOGIC CIRCUITRY, AND SEMICONDUCTOR LOGIC CIRCUIT CONSTRUCTIONS

RELATED PATENT DATA

This patent resulted from a divisional application of U.S. patent application Ser. No. 09/797,098, now U.S. Pat. No. 6,887,753, which was filed Feb. 28, 2001.

TECHNICAL FIELD

The invention pertains to methods of forming semiconductor circuitry. In particular applications, the invention pertains to methods of forming semiconductor logic circuitry. The invention also pertains to semiconductor circuitry constructions, and in particular applications pertains to semiconductor logic circuitry constructions.

BACKGROUND OF THE INVENTION

Technologies referred to as "smart cut" and "wafer-bonding" have been utilized to bond monocrystalline silicon materials onto semiconductor substrates. Smart cut technology generally refers to a process in which a material is implanted into a silicon substrate to a particular depth and ultimately utilized to crack the substrate, and wafer bonding technology generally refers to a process in which a first semiconductive substrate is bonded to a second semiconductor substrate.

In particular applications of smart cut and wafer-bonding technology, hydrogen ions (which can be, for example, $H^+$, $H_2^+$, $D^+$, $D_2^+$) are implanted into a first monocrystalline silicon substrate to a desired depth. The first monocrystalline silicon substrate comprises a silicon dioxide surface, and is bonded to a second monocrystalline substrate through the silicon dioxide surface. Subsequently, the bonded first substrate is subjected to a thermal treatment which causes cleavage along the hydrogen ion implant region to split the first substrate at a pre-defined location. The portion of the first substrate remaining bonded to the second substrate can then be utilized as a silicon-on-insulator (SOI) substrate. An exemplary process is described in U.S. Pat. No. 5,953,622. The SOI substrate is subsequently annealed at a temperature of greater than or equal to 900° C. to strengthen chemical coupling within the second substrate.

The present invention encompasses new applications for smart cut and wafer-bonding technology, and new semiconductor structures which can be created utilizing such applications.

SUMMARY OF THE INVENTION

One aspect of the invention is a method of forming semiconductor circuitry wherein a first semiconductor structure comprising a first monocrystalline semiconductor substrate is bonded to a second semiconductor structure comprising a second monocrystalline semiconductor substrate. The first semiconductor substrate supports an electrical node. A semiconductive material projection electrically connects with the electrical node. The second semiconductor substrate has an electrically conductive interconnect extending therein. The interconnect electrically connects with the semiconductive material projection, and comprises a different dopant type than the semiconductor material projection.

In another aspect, the invention encompasses a method of forming a construction comprising a first monocrystalline semiconductor substrate and a second monocrystalline semiconductor substrate, wherein the first substrate is doped to a first dopant type, and the second substrate is doped to a second dopant type different from the first dopant type.

In other aspects, the invention encompasses methods of forming semiconductor logic circuitry. In yet other aspects, the invention encompasses semiconductor constructions, such as, for example, semiconductor logic circuitry constructions.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing step of a method of the present invention.

FIG. 2 is a diagrammatic, cross-sectional view of a second semiconductor wafer at a preliminary processing step of the present invention.

FIG. 3 is a diagrammatic, cross-sectional view of a structure comprising the semiconductor wafer fragment of FIG. 1 bonded with the second semiconductor wafer fragment of FIG. 2.

FIG. 6 is a view of the FIG. 3 structure shown at a processing step subsequent to that of FIG. 5.

FIG. 7 is a view of the FIG. 3 structure shown at a processing step subsequent to that of FIG. 6.

DETAILED DESCRIPTION OF THE PREFERRED EMBODIMENTS

Figure 4:
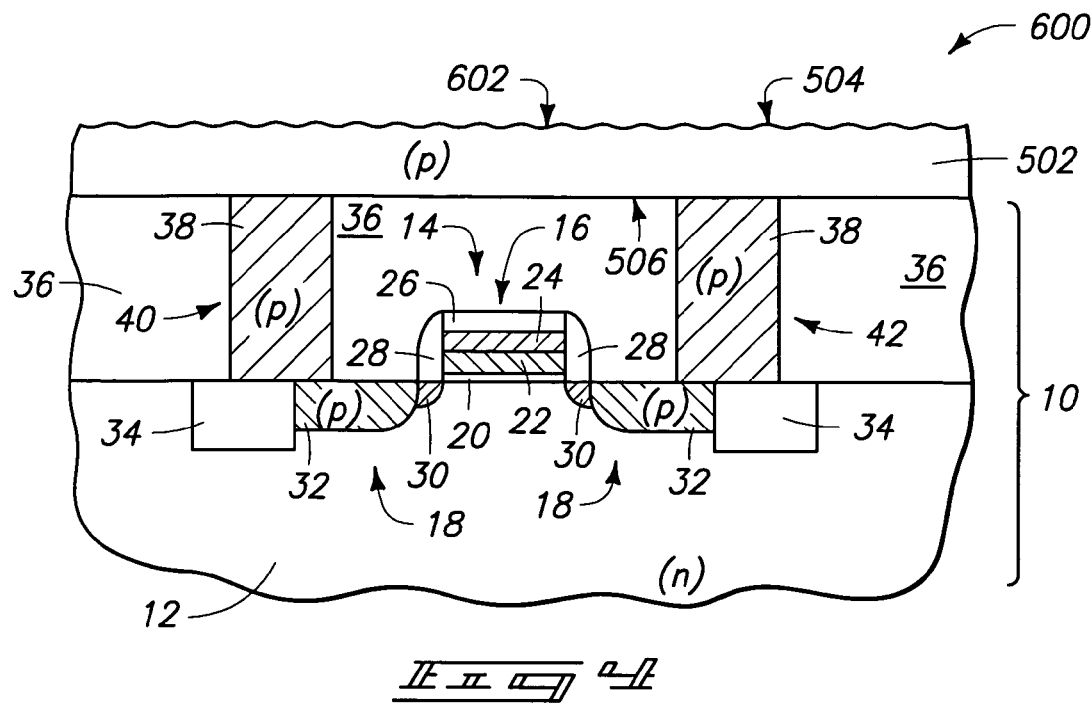
FIG. 4 is a view of the FIG. 3 structure shown at a processing step subsequent to that of FIG. 3.
Figure 5:
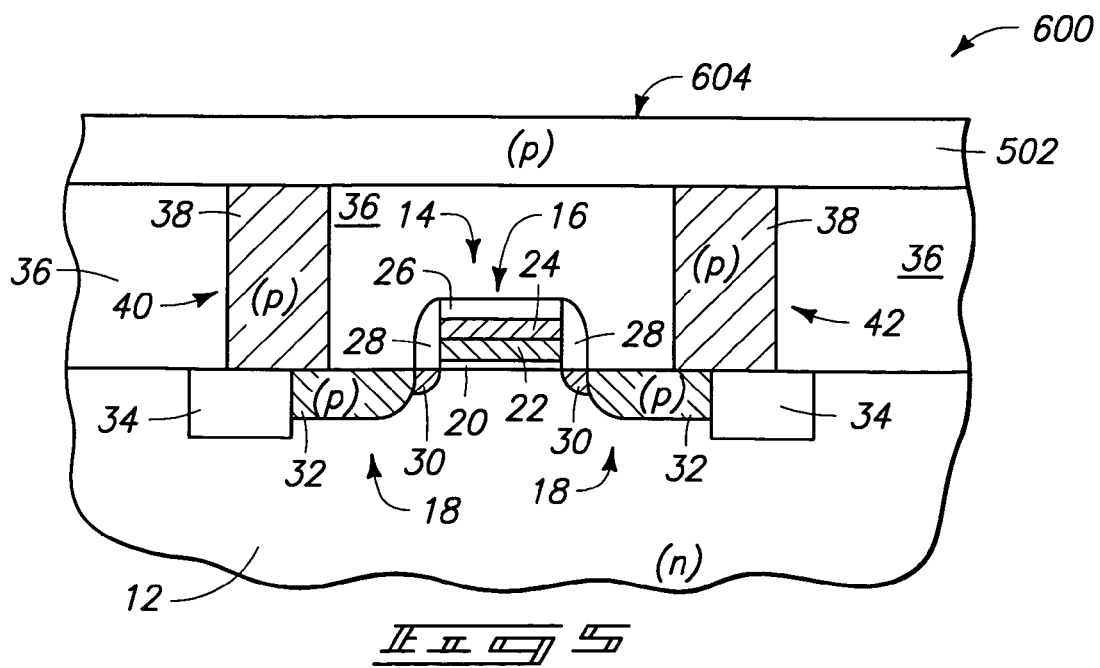
FIG. 5 is a view of the FIG. 3 structure shown at a processing step subsequent to that of FIG. 4.

This disclosure of the invention is submitted in furtherance of the constitutional purposes of the U.S. Patent Laws "to promote the progress of science and useful arts" (Article 1, Section 8).

An exemplary method of the present invention is described with reference to FIGS. 1–9. Referring initially to FIG. 1, a first semiconductor structure 10 is illustrated in fragmentary view. Structure 10 comprises a monocrystalline semiconductor substrate 12. Substrate 12 can comprise, for example, a monocrystalline silicon wafer. Alternatively, substrate 12 can comprise other semiconductive materials besides, or in addition to, silicon, including, for example, germanium. Monocrystalline substrate 12 can be background-doped with either a p-type or n-type dopant, and in the shown embodiment substrate 10 is illustrated to be n-type doped. An n-type substrate is defined as a semiconductive substrate having a higher concentration of n-type dopant than p-type dopant (to the extent that any p-type dopant is present); and similarly a p-type semiconductive substrate is defined as a substrate having a higher concentration of p-type dopant than n-type dopant (to the extent that any p-type dopant is present). For purposes of interpreting this disclosure and the claims that follow, a "background" doping is defined as a dopant provided throughout an entirety of a semiconductive material substrate to a concentration of less than $10^{18}$ atoms/cm$^3$. The terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Structure 10 can be referred to herein and in the claims that follow as a first semiconductor structure, and substrate 12 can be referred to herein and in the claims that follow as a first monocrystalline semiconductor substrate.

A transistor structure 14 is formed to be supported by substrate 12. Transistor structure 14 comprises a transistor gate 16 and source/drain regions 18. Transistor gate 16 comprises a pad oxide layer 20, a first conductive layer 22, a second conductive layer 24, and an insulative cap 26. Pad oxide layer 20 can comprise, for example, silicon dioxide. First conductive layer 22 can comprise, for example, conductively-doped polysilicon. Second conductive layer 24 can comprise, for example, a metal silicide, such as, for example, titanium silicide or tungsten silicide. Insulative cap 26 can comprise, for example, silicon nitride or silicon dioxide. Sidewall spacers 28 are formed along sidewalls of gate 16, and can comprise, for example, silicon nitride or silicon dioxide.

Source/drain regions 18 comprise a lightly-doped region 30 and a heavily-doped region 32. Regions 30 and 32 can comprise either n-type or p-type dopant, and in the shown embodiment are p-type regions. Lightly-doped regions 30 and heavily-doped regions 32 can be doped to typical concentrations utilized for forming conventional transistor structures.

Isolation regions 34 extend within semiconductive substrate 12. Isolation regions 34 can comprise, for example, silicon dioxide, and can be formed as, for example, shallow trench isolation regions.

An insulative mass 36 is formed over substrate 12, and can comprise, for example, borophosphosilicate glass (BPSG). A pair of openings extend through insulative mass 36 and are filled with conductive material 38 to define upwardly extending conductive projections 40 and 42. Conductive material 38 can comprise, for example, conductively doped silicon, such as conductively doped polysilicon. The polysilicon can be either n-type or p-type doped, and in the shown embodiment is doped to be a p-type material. Conductively-doped material 38 preferably comprises a same-type conductive doping as heavily-doped regions 32. Accordingly, if heavily-doped regions 32 are n-type heavily doped, then conductive material 38 can preferably comprise n-type doped polysilicon. Conductive projections 40 and 42 extend downwardly to substrate 12, and connect with source/drain regions 18 of transistor assembly 14. Conductive projections 40 and 42 thus electrically connect with electrical nodes supported by substrate 12, (in the shown embodiment the electrical nodes are source/drain regions 18). For purposes of interpreting this disclosure and the claims that follow, the term "electrical connection" is defined to not encompass selective or switched connections. Accordingly, conductive projection 40 is to be understood as being in electrical connection with a source/drain region 32 illustrated on the left of gate 16, but to not be in electrical connection with a source/drain region 32 illustrated on the right of gate 16. Similarly, conductive projection 42 is to be understood as being in electrical connection with a source/drain region 32 illustrated on the right of gate 16, but to not be in electrical connection with a source/drain region 32 illustrated on the left of gate 16.

The plugs 40 and 42 of the FIG. 1 structure are shown to overlap isolation regions 34, as well as overlapping source/drain regions 32. The partial overlap of plugs 40 and 42 on isolation regions 34 can allow formation of a relatively compact device. It is to be understood, however, that the invention encompasses other embodiments wherein at least one of the plugs 40 and 42 is entirely over a source/drain region 32 and does not overlap an isolation region 34.

Structure 10 has an upper surface 44 that is preferably substantially planar. The term "substantially planar" is defined herein to refer to a surface defined by a roughness of less than 5 Å root mean square (rms) variation, and more preferably less than 2 Å rms variation.

FIG. 2 shows a second semiconductor structure 500 comprising a second monocrystalline semiconductor substrate 502. Second monocrystalline semiconductor substrate 502 can comprise, for example, monocrystalline silicon, and can be background-doped with n-type or p-type dopant. In the shown embodiment of the present invention, second monocrystalline substrate 502 comprises monocrystalline semiconductive material (such as, for example, monocrystalline silicon) doped with p-type background dopant, and first monocrystalline substrate 12 comprises monocrystalline semiconductive material (such as, for example, monocrystalline silicon) doped with n-type background dopant. Accordingly, second monocrystalline substrate 502 is background doped with a different type of dopant than is first monocrystalline substrate 12.

Substrate 502 comprises a damage region 504 formed therein. Damage region 504 can be formed by, for example, implanting hydrogen ions into wafer 502. Wafer 502 has an upper surface 506 which is preferably substantially planar.

Referring to FIG. 3, second structure 500 is inverted and bonded to first structure 10 to form a resulting structure 600. More specifically, surface 506 of substrate 502 is bonded to surface 44 of substrate 10. The bonding of substrate 502 to substrate 10 can be accomplished with a temperature of less than or equal to about 700° C. for a time of at least about 15 minutes. A suitable time can be from about 15 minutes to about two hours. The bonding can occur under a nitrogen atmosphere at about atmospheric pressure, or alternatively can occur under a vacuum. A suitable vacuum is less than or equal to about 500 mTorr, and preferably less than or equal to about 10 mTorr. In a particular embodiment, the bonding can comprise a first temperature treatment of less than 500° C., and a second temperature treatment of less than or equal to about 700° C. The treatment occurring at a temperature of less than about 500° C. can be utilized as a preliminary bonding prior to cleaving of substrate 502 (described below with reference to FIG. 4), and the bonding at 700° C. can occur after such cleaving to enhance chemical coupling between substrate 502 and upper surface 44 of structure 10.

In particular embodiments of the invention, the only temperatures utilized for bonding are less than or equal to 700° C., and monocrystalline substrates 12 and 502 are not exposed to temperatures exceeding 700° C. after the bonding. An advantage of utilizing temperatures less than or equal to about 700° C. for bonding and subsequent processing of structure 600 is that such could alleviate diffusion of dopants within substrates 12 and 502 relative to diffusion which would occur at higher temperatures.

In embodiments in which diffusion of dopants is not considered problematic, temperatures above 700° C. can be utilized for bonding substrate 502 to structure 10. If insulative mask 36 comprises silicon dioxide, such embodiments can comprise temperatures high enough to bond the silicon dioxide of mass 36 to the monocrystalline silicon of base 502, such as, for example, temperatures of 900° C. or greater. On the other hand, temperatures of 700° C. or less can be utilized to bond polycrystalline silicon conductive material 38 to base 502, even though such temperatures will probably not effectively bond insulative material 36 to base 502.

Referring to FIG. 4, substrate 502 is cleaved along damage region 504. In embodiments in which damage region 504 corresponds to a region wherein hydrogen ions were implanted, the cleavage can be accomplished by thermal processing. Suitable thermal processing can include, for example, exposure of damage region 504 to a temperature of greater than or equal to about 500° C.

The cleavage leaves a roughened upper surface 602 of structure 600. Such roughened surface can be planarized by, for example, chemical-mechanical planarization to form the planar upper surface 604 shown in FIG. 5. In particular embodiments, the thickness of fragment 502 remaining after cleavage (FIG. 4) is about 0.5 $\mu$m, and the thickness after planarization (FIG. 5) is about 0.3 $\mu$m. The planarization shown in FIG. 5 can be referred to as "smoothing" of the roughened upper surface 602 of the FIG. 4 structure 600.

Referring next to FIG. 6, a pair of insulative material regions 606 and 608 are formed within monocrystalline substrate 502. Regions 606 and 608 can comprise, for example, silicon dioxide or silicon nitride. Regions 606 and 608 can be formed by, for example, etching trenches through substrate 502, and subsequently refilling the trenches with silicon dioxide. It is noted that insulative region 606 entirely covers conductive projection 40, while insulative region 608 only partially covers conductive projection 42.

Referring next to FIG. 7, a transistor structure 610 is formed to be supported by second monocrystalline substrate 502. Transistor structure 610 comprises a transistor gate 612 and source/drain regions 614. Transistor gate 612 comprises a pad oxide 616, a first conductive region 618, a second conductive region 620, and an insulative cap 622. Pad oxide 616, first conductive region 618, second conductive region 620 and insulative cap 622 can comprise the same materials as discussed above for pad oxide 20, first conductive region 22, second conductive region 24, and insulative material 26, respectively, of transistor gate 16 of FIG. 1. A pair of sidewall spacers 624 are formed along sidewalls of transistor gate 612. Sidewall spacers 624 can comprise, for example, silicon dioxide or silicon nitride.

Source/drain regions 614 comprise a lightly doped region 626 and a heavily doped region 628. Regions 626 and 628 can comprise either n-type dopant or p-type dopant. In the shown embodiment, heavily-doped regions 628 are n-type regions.

Transistor structure 610 can be formed by conventional methods, such as, for example, by forming transistor gate 612 over substrate 502, and subsequently implanting dopant to form lightly-doped regions 626 within base 502. Spacers 624 can then be formed adjacent gate 612, followed by implanting dopant to form heavily doped regions 628 within base 502.

An insulative mass 630 is formed over transistor structure 610, as well as over base 502. Insulative mass 630 can comprise, for example, BPSG.

Figure 8:
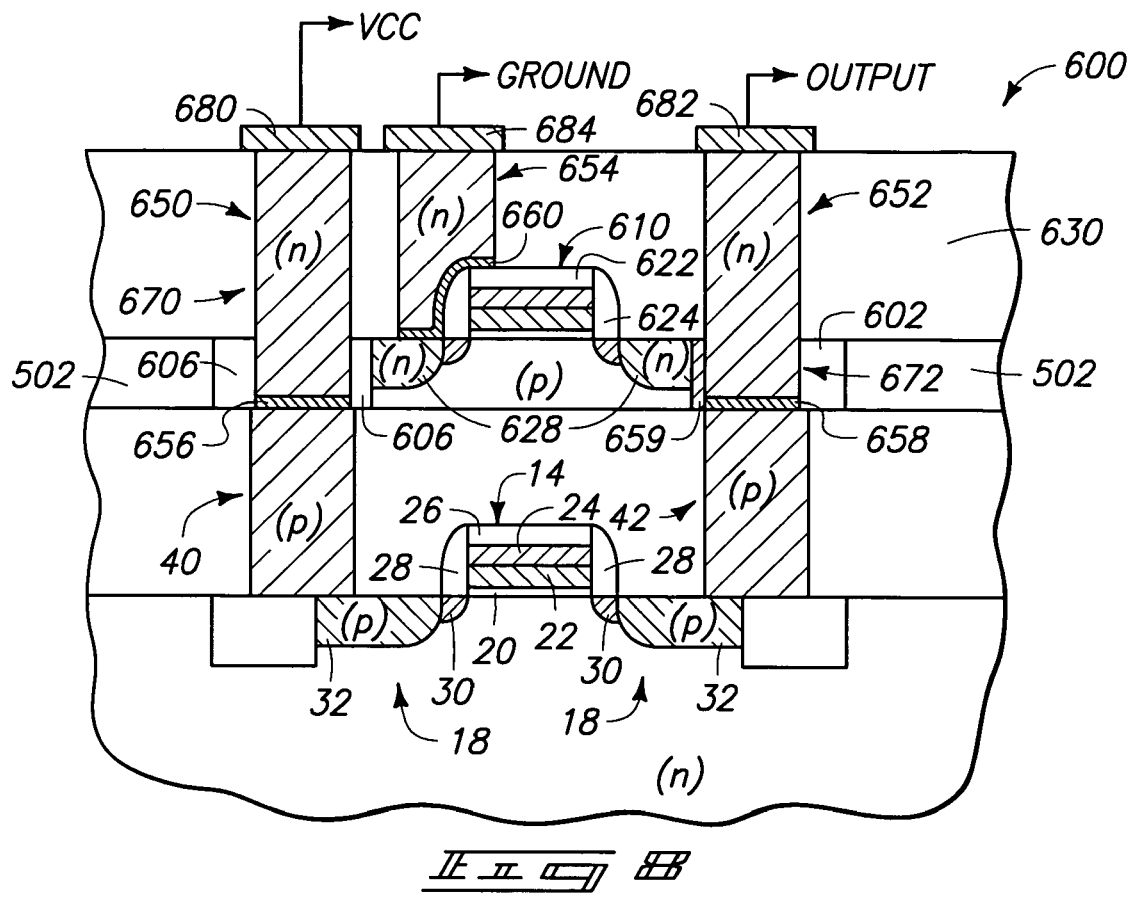
FIG. 8 is a view of the FIG. 3 structure shown at a processing step subsequent to that of FIG. 7. The structure of FIG. 8 can be incorporated into an inverter logic circuit.

Referring next to FIG. 8, conductive interconnects 650, 652 and 654 are formed through insulative material 630. Conductive interconnects 650 and 652 can be referred to as first and second conductive interconnects, respectively, and interconnect 654 can be referred to as a third conductive interconnect. Conductive interconnects 650 and 652 extend through base 502 to connect with conductive projections 40 and 42, respectively. In the shown embodiment, conductive interconnects 650 and 652 comprise n-type doped semiconductive material, and conductive interconnects 40 and 42 comprise p-type doped semiconductive material. Conductive interconnects 650 and 652 can comprise, for example, n-type doped polycrystalline silicon. Metal silicide layers 656 and 658 are formed at interfaces of the n-type semiconductive material and p-type semiconductive material. The metal silicide can be formed by sputter deposition from a highly collimated source.

Conductive interconnect 654 is also shown to comprise n-type doped semiconductive material, but unlike conductive interconnects 650 and 652, conductive interconnect 654 stops at an upper surface of monocrystalline base 502. Typically, conductive interconnects 650 and 652 would be formed in a separate etch step from conductive interconnect 654, in that conductive interconnects 650 and 652 are etched through base 502, while conductive interconnect 654 is not. The etch to form an opening for conductive interconnect 654 is preferably highly selective for the material 630 relative to the materials 622 and 624. For instance, material 630 can comprise BPSG and materials 622 and 624 can comprise silicon nitride so that an etch highly selective for silicon oxide to silicon nitride is used to form the opening for interconnect 654. The etch can also be selective for silicon oxide relative to silicon if base 502 comprises monocrystalline silicon so that the etch stops at about an upper surface of base 502.

Conductive interconnect 654 is shown having a metal silicide layer 660 at an interface between conductive interconnect 654 and heavily doped source/drain region 628. The metal silicide 660 is optional in the shown embodiment, since conductive interconnect 654 and source/drain region 628 both comprise the same. conductivity type doping (specifically, n-type doping).

Conductive interconnect 650 and projection 40 together define a conductive extension 670 (which can also be referred to as a conductive interconnect), and likewise conductive interconnect 652 and projection 42 together define a conductive extension 672 (which can also be referred to as a conductive interconnect). Conductive extensions 670 and 672 can be considered to comprise upper portions (either 650 or 652) and lower portions (either 40 or 42), with the upper portions having a different conductivity type than the lower portions. Further, conductive extensions 670 and 672 can be considered to comprise a metal silicide (either 656 or 658) at an interface of the upper portions and the lower portions. The metal silicide can comprise, for example, titanium silicide. In the shown embodiment, the upper portions extend only partially through the substrate 502, so that the metal silicide interface is within substrate 502. It is to be understood that the invention encompasses other embodiments in which the upper portions extend entirely through the second monocrystalline semiconductive substrate (see, for example, FIG. 10 for an exemplary embodiment in which the upper portions extend entirely through a second monocrystalline semiconductive substrate).

In the embodiment of FIG. 8, an n-type doped region 659 is formed proximate conductive interconnect 652 by out-diffusion of n-type dopant from the interconnect into base 502. Such out-diffusion can be accomplished by, for example, thermal processing of structure 600. Doped region 659 can improve an electrical interconnection between conductive extension 652 and an adjacent source/drain region 628.

It is to be understood that even though the invention is illustrated in FIG. 8 with a lower monocrystalline semiconductive substrate being n-type doped and an upper monocrystalline semiconductor substrate being p-type doped, the substrates can be reversed. Further, for purposes of interpreting this disclosure and the claims that follow, the spatial reference terms "over", "above", "beneath" and the like are utilized to describe relative orientations of various components to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

The structure of FIG. 8 is shown incorporated into logic circuitry. Specifically, conductive interconnect 650 is shown joined to a conductive connection 680, which joins with $V_{cc}$; conductive interconnect 652 is shown joined with a conductive connection 682 which joins with an output of a logic device, and conductive interconnect 654 is shown joined with a conductive connection 684 that is connected to ground. The structures 670, 672 and 654 of FIG. 8 are shown in a common plane to simplify illustration of such structures. It is to be understood that the invention can be practiced with one or more of structures 670, 672 and 654 in a different cross-sectional plane relative to the other structures.

Figure 9:
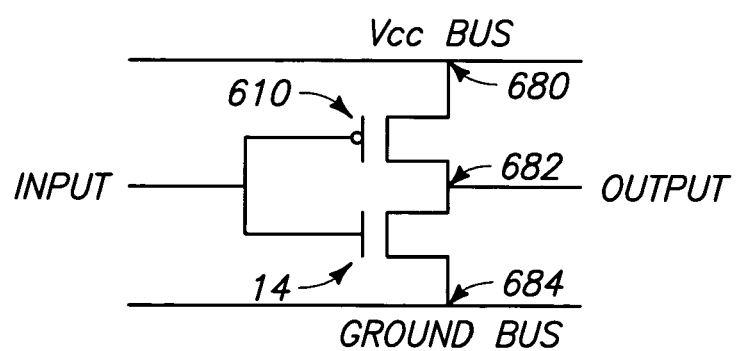
FIG. 9 is a circuit diagram of an inverter circuit, such as can comprise the structure of FIG. 8.

FIG. 9 illustrates a circuit diagram of a logic device which can incorporate the circuitry shown in FIG. 8.

The circuitry of FIG. 9 constitutes what is known in the art as a "logic inverter". As can be seen in the diagram of FIG. 9, there would be an input (not shown in FIG. 8) feeding into transistor gate regions 16 and 612. Such input can be considered as being out of the shown cross-sectional plane of FIG. 8, and can comprise, for example, a conductive component perpendicular to the shown cross-sectional plane of FIG. 8.

Figure 10:
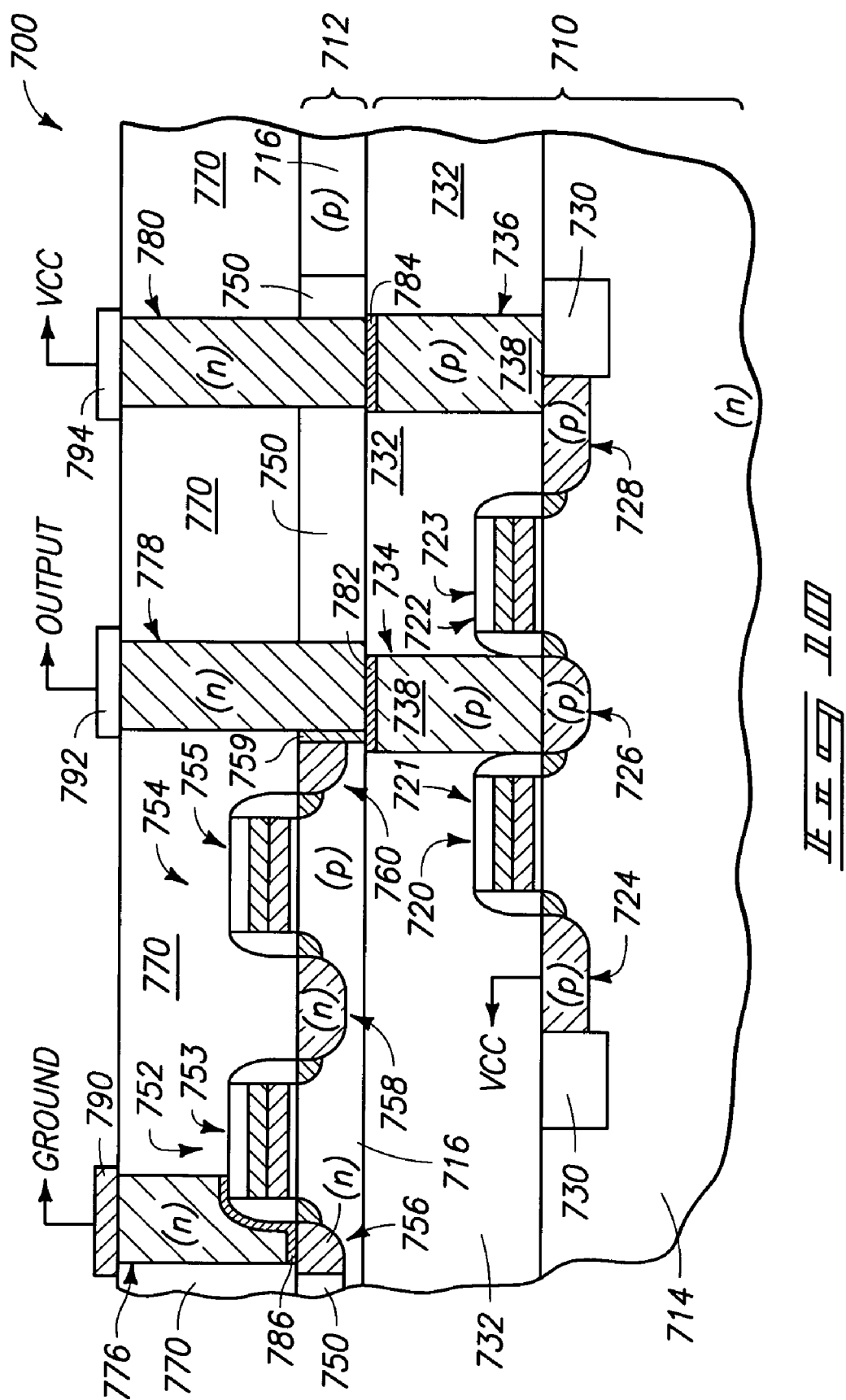
FIG. 10 is a view of a semiconductor structure formed in accordance with a second embodiment of the present invention. The FIG. 10 substrate can be incorporated into NAND gate logic circuitry.
Figure 11:
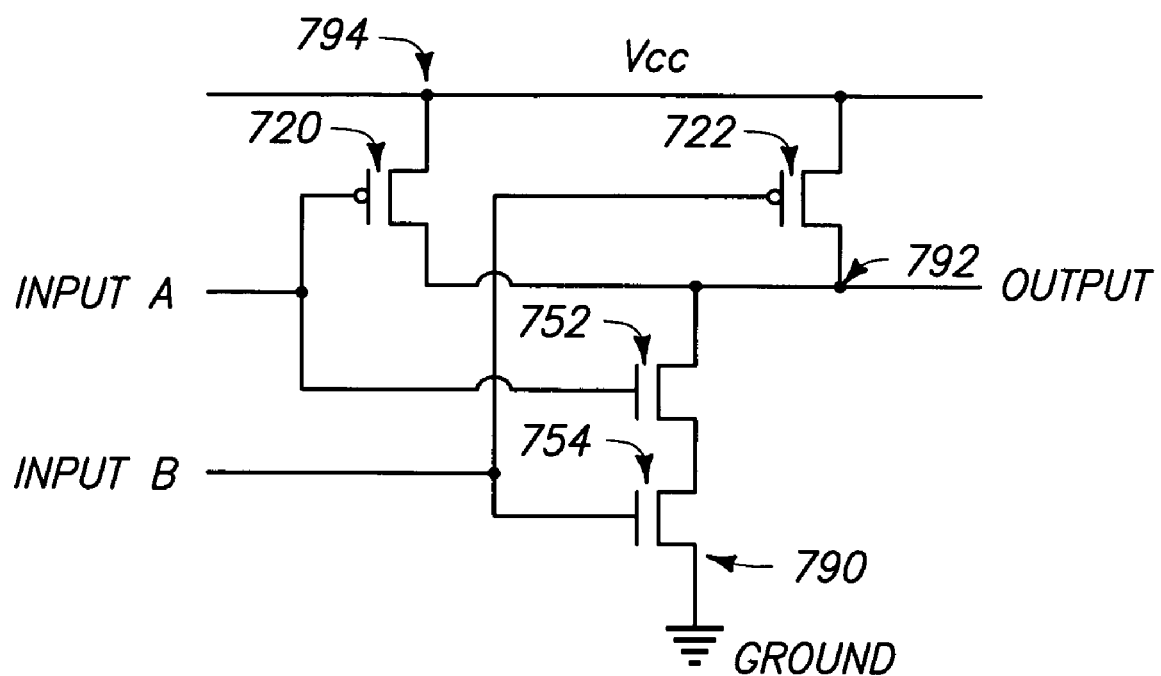
FIG. 11 is a circuit diagram of NAND gate logic, such as can comprise the structure of FIG. 10.

The structure of FIG. 8 is but one type of logic device that can be formed utilizing methodology of the present invention. FIGS. 10 and 11 illustrate another type of logic device that can be formed, with the logic device of FIGS. 10 and 11 being a so-called NAND gate logic structure.

FIG. 10 illustrates a structure 700 comprising a first structure 710 and a second structure 712 bonded thereto. Structure 710 is analogous to the structure 10 of FIG. 1, and comprises a first monocrystalline semiconductor substrate 714; and structure 712 is analogous to the second semiconductor structure 500 of FIG. 2, and comprises a second monocrystalline semiconductor substrate 716. First monocrystalline substrate 714 can comprise, for example, monocrystalline silicon doped with a background n-type dopant, and second monocrystalline substrate 716 can comprise monocrystalline silicon background doped with a p-type dopant.

Structure 710 comprises transistor structures 720 and 722 supported by substrate 714. Transistor structures 720 and 722 comprise transistor gates 721 and 723, and source/drain regions 724, 726, and 728 adjacent the transistor gates.

Isolation regions 730 are formed within substrate 714, and can comprise, for example, shallow trench isolation regions.

An insulative mass 732 is formed over transistor structures 720 and 722, as well as over first monocrystalline substrate 714. Insulative mass 732 can comprise, for example, BPSG.

Conductive projections 734 and 736 extend through insulative mass 732 to electrically connected with electrical nodes supported by substrate 714 (specifically, to electrically connect with source/drain regions 726 and 728), and in shown embodiment physically contact substrate 714. Conductive projections 734 and 736 comprise a conductive material 738, such as, for example, conductively doped polycrystalline silicon. In the shown embodiment, conductive material 738 is p-type doped.

After formation of conductive projections 734 and 736, second structure 712 can be bonded to first structure 710 utilizing processing analogous to that described above with reference to FIGS. 1–5. Specifically, second structure 712 can initially comprise a monocrystalline substrate having a damage region formed therein. The monocrystalline substrate can be bonded to first semiconductive structure 710, and subsequently cleaved along the damage region and planarized.

After structure 712 is bonded to structure 710, an oxide region 750 can be formed within monocrystalline material 716. Also, transistor structures 752 and 754 can be formed to be supported by monocrystalline substrate 716. Transistor structures 752 and 754 comprise source/drain regions 756, 758 and 760 proximate transistor gates 753 and 755. An insulative mass 770 is formed over transistor structures 752 and 754, as well as over monocrystalline substrate 716. Subsequently, conductive extensions 776, 778 and 780 are formed to extend through insulative mass 770.

Conductive extension 776 terminates on monocrystalline substrate 712 at source/drain region 756, whereas conductive extensions 778 and 780 extend through monocrystalline substrate 712 to connect with projections 734 and 736, respectively. Conductive extensions 776, 778 and 780 are shown to comprise conductively-doped semiconductive material, and specifically are shown to comprise n-type doped conductive material. Extensions 776, 778 and 780 can comprise, for example, n-type doped polysilicon. Metal silicide regions 782 and 784 are shown at interfaces of n-type doped semiconductive material and p-type doped semiconductive material. Also, a metal silicide region 786 is shown at an interface of conductive extension 776 and source/drain region 756. Metal silicide regions 782, 784 and 786 can comprise, for example, titanium silicide, cobalt silicide, tungsten silicide, or other refractory silicides. In addition, or alternatively, the regions can comprise refractory metal nitrides, such as, for example, titanium nitride.

An out-diffused dopant region 759 is shown adjacent extension 778, and can be formed by methodology similar to that described above with reference to FIG. 8 for forming region 659.

Conductive extension 776 is shown joined to a conductive contact 790, which ultimately connects with ground; conductive interconnect 778 is shown in connection with a conductive contact 792 which ultimately connects with output; and conductive interconnect 780 is shown in electrical connection with a conductive contact 794 which ultimately connects with $V_{cc}$.

FIG. 11 shows a circuit diagram of the NAND device of FIG. 10. FIG. 11 also illustrates that there would be a pair of inputs going into the device of FIG. 10 which are not shown in the diagram of FIG. 10. The inputs could, for example, comprise electrical connections extending into and out of the shown cross-sectional plane of FIG. 10. Additionally, FIG. 11 shows that there are electrical connections between transistor gates 752 and 720, as well as between transistor gates 754 and 722. Such electrical connections can extend outside of the shown cross-sectional plane of FIG. 10. Also, it is to be understood that the cross-sectional plane illustrated in FIG. 10 is shown for diagrammatic purposes only. In practice, one or more of the structures shown in the cross-sectional plane of FIG. 10 can be formed in a different plane relative to other structures illustrated in the cross-sectional plane of FIG. 10, as will be understood by persons of ordinary skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming semiconductor logic circuitry, comprising:
providing a first semiconductor structure; the first semiconductor structure comprising a first monocrystalline semiconductor substrate;
bonding a second semiconductor structure onto the first semiconductor structure; the second semiconductor structure comprising a second monocrystalline semiconductor substrate;
forming a pair of electrically conductive interconnects extending through the second monocrystalline semiconductor substrate to electrically connect with a pair of electrical nodes supported by the first monocrystalline semiconductor substrate; the pair of electrically conductive interconnects being a first electrically conductive interconnect and a second electrically conductive interconnect;
forming a third electrically conductive interconnect; the third electrically conductive interconnect being in electrically connection with an electrically node supported by the second monocrystalline semiconductor substrate; and
connecting the first, second and third electrically conductive interconnects to Vcc, output and ground, respectively, of a semiconductor logic circuit.

2. The method of claim 1 further comprising forming a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect is electrically connected with the other of the first transistor device source/drain regions.

3. The method of claim 1 further comprising:
forming a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect is electrically connected with the other of the first transistor device source/drain regions; and
forming a second transistor device supported on the second monocrystalline semiconductor substrate; the second transistor device comprising a transistor gate, and a pair of source/drain regions; and wherein the second electrically conductive interconnect is electrically connected with one of the second transistor device source/drain regions and the third electrically conductive interconnect is electrically connected with the other of the second transistor device source/drain regions.

4. The method of claim 1 further comprising:
forming a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect is electrically connected with the other of the first transistor device source/drain regions;
forming a second transistor device supported on the second monocrystalline semiconductor substrate; the second transistor device comprising a transistor gate, and a pair of source/drain regions; wherein the second electrically conductive interconnect is electrically connected with one of the second transistor device source/drain regions; and
forming a third transistor device supported on the second monocrystalline semiconductor substrate; the third transistor device comprising a transistor gate, and a pair of source/drain regions; wherein the third electrically conductive interconnect is electrically connected with one of the third transistor device source/drain regions; and wherein the other of the third transistor device source/drain regions electrically connected with the other of the second transistor device source/drain regions.

5. The method of claim 4 further comprising:
forming a fourth transistor device supported on the first monocrystalline semiconductor substrate; the fourth transistor device comprising a transistor gate, and a pair of source/drain regions; wherein one of the fourth transistor device source/drain regions is electrically connected with the other of the first transistor device source/drain regions, and accordingly is electrically connected with the second electrically conductive interconnect;
wherein the third transistor device transistor gate is electrically connected with the fourth transistor device transistor gate; and
wherein the second transistor device transistor gate is electrically connected with the first transistor device transistor gate.

6. The method of claim 1 wherein the second semiconductor structure comprises a damage region formed by implanting hydrogen ions into the second monocrystalline semiconductor substrate; and further comprising, after the bonding, exposing the second monocrystalline semiconductor substrate to thermal conditions sufficient to cleave the second monocrystalline semiconductor substrate along the damage region.

7. The method of claim 6 wherein the cleaving forms a roughened upper surface of the second monocrystalline semiconductor substrate and further comprising planarizing the roughened upper surface of the second monocrystalline semiconductor substrate with chemical-mechanical polishing.

8. The method of claim 1 wherein the first and second electrically conductive interconnects are defined to comprise upper portions extending within the second monocrystalline semiconductor substrate and to comprise lower portions extending between the upper portions and the first monocrystalline semiconductor substrate; the first and second electrically conductive interconnects comprising a semiconductive material; the upper portions being conductively doped to one of n-type or p-type; and the lower portions being conductively doped to the other of n-type and p-type.

9. The method of claim 8 wherein the upper portions extend entirely through the second monocrystalline semiconductor substrate.

10. The method of claim 8 further comprising forming metal silicide between the upper and lower portions of the first and second electrically conductive interconnects.

11. The method of claim 8 further comprising forming metal nitride between the upper and lower portions of the first and second electrically conductive interconnects.

12. A semiconductor logic circuit construction, comprising:
a first monocrystalline semiconductor substrate supporting a pair of electrical nodes;
a second monocrystalline semiconductor substrate bonded above the first monocrystalline semiconductor substrate, the second monocrystalline semiconductor substrate supporting an electrical node;
a pair of electrically conductive interconnects extending through the second monocrystalline semiconductor substrate and electrically connecting with the two electrical nodes supported by the first monocrystalline semiconductor substrate; the pair of electrically conductive interconnects being a first electrically conductive interconnect and a second electrically conductive interconnect;
a third electrically conductive interconnect; the third electrically conductive interconnect being in electrically connection with the electrically node supported by the second monocrystalline semiconductor substrate; and
wherein the first, second and third electrically conductive interconnects are in electrical connection with Vcc, output and ground, respectively, of a semiconductor logic circuit.

13. The construction of claim 12 wherein the first and second monocrystalline semiconductor substrates comprise monocrystalline silicon.

14. The construction of claim 12 further comprising a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect is electrically connected with the other of the first transistor device source/drain regions.

15. The construction of claim 12 further comprising:
a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect Is electrically connected with the other of the first transistor device source/drain regions: and
a second transistor device supported on the second monocrystalline semiconductor substrate; the second transistor device comprising a transistor gate, and a pair of source/drain regions; and wherein the second electrically conductive interconnect is electrically connected with one of the second transistor device source/drain regions and the third electrically conductive interconnect is electrically connected with the other of the second transistor device source/drain regions.

16. The construction of claim 12 further comprising:
a first transistor device supported on the first monocrystalline semiconductor substrate; the first transistor device comprising a transistor gate, and a pair of source/drain regions; and wherein the first electrically conductive interconnect is electrically connected with one of the first transistor device source/drain regions and the second electrically conductive interconnect is electrically connected with the other of the first transistor device source/drain regions;
a second transistor device supported on the second monocrystalline semiconductor substrate; the second transistor device comprising a transistor gate, and a pair of source/drain regions; wherein the second electrically conductive interconnect is electrically connected with one of the second transistor device source/drain regions; and
a third transistor device supported on the second monocrystalline semiconductor substrate; the third transistor device comprising a transistor gate, and a pair of source/drain regions; wherein the third electrically conductive interconnect is electrically connected with one of the third transistor device source/drain regions; and wherein the other of the third transistor device source/drain regions electrically connected with the other of the second transistor device source/drain regions.

17. The method of claim 16 further comprising:
a fourth transistor device supported on the first monocrystalline semiconductor substrate; the fourth transistor device comprising a transistor gate, and a pair of source/drain regions; wherein one of the fourth transistor device source/drain regions is electrically connected with the other of the first transistor device source/drain regions, and accordingly is electrically connected with the second electrically conductive interconnect;
wherein the third transistor device transistor gate is electrically connected with the fourth transistor device transistor gate; and
wherein the second transistor device transistor gate is electrically connected with the first transistor device transistor gate.

18. The construction of claim 12 wherein the first and second electrically conductive interconnects are defined to comprise upper portions extending within the second monocrystalline semiconductor substrate and to comprise lower portions extending between the upper portions and the first monocrystalline semiconductor substrate; the first and second electrically conductive interconnects comprising a semiconductive material; the upper portions being conductively doped to one of n-type or p-type; and the lower portions being conductively doped to the other of n-type and p-type.

19. The construction of claim 18 wherein the semiconductive material comprised by the first and second electrically conductive interconnects consists essentially of silicon.

20. The construction of claim 18 wherein the first and second electrically conductive interconnects extend entirely through the second monocrystalline semiconductor substrate.

21. The construction of claim 18 further comprising metal silicide between the upper and lower portions of the first and second electrically conductive interconnects.

22. The construction of claim 18 further comprising metal nitride between the upper and lower portions of the first and second electrically conductive interconnects.

* * * * *

UNITED STATES PATENT AND TRADEMARK OFFICE
CERTIFICATE OF CORRECTION

PATENT NO. : 6,964,896 B2  Page 1 of 1
APPLICATION NO. : 10/931579
DATED : November 15, 2005
INVENTOR(S) : Fernando Gonzalez It is certified that error appears in the above-identified patent and that said Letters Patent is hereby corrected as shown below:

Col. 12, line 19 –
   Replace "17. The method of claim 16 further comprising:"
   With --17. The construction of claim 16 further comprising:--

Col. 6, line 44 –
   Replace "628 both comprise the same. conductivity type doping"
   Insert --628 both comprise the same conductivity type doping --

Col. 11, line 43 –
   Replace "interconnect Is electrically connected with the other of the"
   Insert -- interconnect is electrically connected with the other of the --

Signed and Sealed this

Twenty-second Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 6,964,896 B2  Page 1 of 1
APPLICATION NO. : 10/931579
DATED : November 15, 2005
INVENTOR(S) : Fernando Gonzalez It is certified that error appears in the above-identified patent and that said Letters Patent is hereby corrected as shown below:

Col. 12, line 19 –
  Replace "17. The method of claim 16 further comprising:"
  With --17. The construction of claim 16 further comprising:--

Signed and Sealed this

Twelfth Day of June, 2007

JON W. DUDAS
*Director of the United States Patent and Trademark Office*